United States Patent
McKenzie et al.

(10) Patent No.: US 8,324,633 B2
(45) Date of Patent: Dec. 4, 2012

(54) ULTRA HIGH THERMAL PERFORMANCE PACKAGING FOR OPTOELECTRONICS DEVICES

(75) Inventors: James Stuart McKenzie, Falmouth (GB); Majd Zoorob, Southhampton (GB)

(73) Assignee: PhotonStar LED Limited, Romsey (GB)

( * ) Notice: Subject to any disclaimer, the term of this patent is extended or adjusted under 35 U.S.C. 154(b) by 222 days.

(21) Appl. No.: 12/742,246

(22) PCT Filed: Nov. 10, 2008

(86) PCT No.: PCT/GB2008/003773
§ 371 (c)(1),
(2), (4) Date: May 10, 2010

(87) PCT Pub. No.: WO2009/060219
PCT Pub. Date: May 14, 2009

(65) Prior Publication Data
US 2011/0101394 A1    May 5, 2011

(30) Foreign Application Priority Data
Nov. 8, 2007  (GB) .................... 0721957.9

(51) Int. Cl.
*H01L 27/15*       (2006.01)
*H01L 31/12*       (2006.01)
*H01L 33/00*       (2010.01)

(52) U.S. Cl. ............ 257/79; 257/86; 257/288; 257/720; 257/E21.006; 257/E21.053; 257/E21.077; 257/E21.17; 257/E21.229; 257/E21.352

(58) Field of Classification Search .................. 257/79, 257/88, 98, 99, 280, 720, E21.006, E21.053, 257/E21.077, E21.352
See application file for complete search history.

(56) References Cited

U.S. PATENT DOCUMENTS
6,770,498 B2    8/2004  Hsu
(Continued)

FOREIGN PATENT DOCUMENTS
| DE | 10 2007 002156 | 7/2008 |
| EP | 1 662 587 | 5/2006 |
| WO | 2005/029572 | 3/2005 |
| WO | 2005/088743 | 9/2005 |
| WO | 2007/037762 | 4/2007 |

OTHER PUBLICATIONS

Chen et al., "High Thermal Dissipation of Ultra High Power Light-Emitting Diodes by Copper Electroplating," Proceedings—Electronic Components and Technology, Conference—Proceedings—57th Electronic Components and Technology Conference 2007, ECTC '07 2007 Institute of Electrical and Electronics Engineers Inc., US, May 5, 2007 to Jun. 1, 2007, pp. 734-736. UK Search Report for corresponding GB Application No. 0721957.9, dated Mar. 27, 2008. International Search Report and Written Opinion of Corresponding International Application No. PCT/GB2008/003773, dated Jun. 30, 2009.

*Primary Examiner* — David Nhu
(74) *Attorney, Agent, or Firm* — Renner, Otto, Boisselle & Sklar, LLP (57) ABSTRACT

A light emitting module comprises a light emitting device (LED) mounted on a high thermal dissipation sub-mount, which performs the traditionally function of heat spread and the first part of the heat sinking. The sub-mount is a grown metal that is formed by an electroplating, electroforming, electrodeposition or electroless plating process, thereby minimizing thermal resistance at this stage. An electrically insulating and thermally conducting layer is at least partially disposed across the interface between the grown semiconductor layers of the light emitting device and the formed metal layers of the sub-mount to further improve the electrical isolation of the light emitting device from the grown sub-mount. The top surface of the LED is protected from electroplating or electroforming by a wax or polymer or other removable material on a temporary substrate, mold or mandrel, which can be removed after plating, thereby releasing the LED module for subsequent processing.

19 Claims, 9 Drawing Sheets

U.S. PATENT DOCUMENTS

| | | |
|---|---|---|
| 6,884,646 B1 | 4/2005 | Wu et al. |
| 2002/0092166 A1 | 7/2002 | Jacobs et al. |
| 2003/0062526 A1 | 4/2003 | Romano et al. |
| 2004/0245543 A1 | 12/2004 | Yoo |
| 2006/0091409 A1 | 5/2006 | Epler et al. |
| 2006/0091415 A1* | 5/2006 | Yan .................................. 257/99 |
| 2006/0154389 A1 | 7/2006 | Doan |
| 2006/0154393 A1 | 7/2006 | Doan et al. |
| 2006/0214178 A1 | 9/2006 | Choi et al. |

* cited by examiner

ULTRA HIGH THERMAL PERFORMANCE PACKAGING FOR OPTOELECTRONICS DEVICES

This application is a national phase of International Application No. PCT/GB2008/003773 filed Nov. 10, 2008, and published in the English language as WO 2009/060219 on May 14, 2009.

FIELD OF THE INVENTION

The present invention relates to an improved module and packaging technique providing high thermal performance for light emitting devices, particularly Light Emitting Diodes (LEDs).

BACKGROUND TO THE INVENTION

There are many types of packages used to manage the thermal, optical and electrical connections to small optoelectronic devices. This reason for this is the inherent conflict arising between thermal conductivity and electrical insulation when selecting suitable materials for packaging. Typical Optoelectronic devices include lasers, LEDs, detectors and photovoltaic devices. The largest challenges associated with the packaging come from electrically pumped light emitting devices. The conversion from electrical energy to light photons out dictates that the associated wall plug efficiency of the device is never unity, thereby introducing substantial heating in the vicinity of the small format device.

Of particular interest to the present invention are semiconductor light emitting diodes (LED) and lasers. These comprise of a chip level small format device and are typically driven at high drive currents resulting in high power densities generated inside the material causing local heating effects.

Light emitting diodes are based on a forward biased p-n junction. LEDs have recently reached high brightness levels that have allowed them to be used in new solid state lighting applications, as well as replacements for high brightness light sources, such as light engines for projectors and automotive car headlights. These markets have also been enabled by the economical gains achieved through the high efficiencies of LEDs, and also the reliability, long lifetime and environmental benefits. These gains have been partly achieved by use of LEDs that are capable of being driven at high currents and hence produce high luminous outputs while still maintaining high wall plug efficiencies.

The efficiency of the LED is critical to ensure that solid state lighting is adopted for general lighting applications and to provide an environmentally friendly lighting solution for future generations. LED lighting has the potential to be up to 20 times more efficient than the incandescent light bulb and to last 50-100 times longer (lasting up to 100,000 hrs), resulting in less physical waste, large energy savings and lower cost of ownership. Solid state lighting applications require that LEDs exceed efficiencies currently achievable by alternative fluorescent lighting technologies.

Current state of the art LED device performances have recently been demonstrated by Nichia Corporation, with a luminous efficacy figure of 161 lumen per Watt (LPW) being quoted for a white LED at an operating power of 61 mW. At the same time, both Nichia Corporation and Cree Inc. have recently achieved 134 lm/W and 129 lm/W, respectively, for high power LED devices at 350 mA current drive. The theoretical maximum is between 260 LPW and 330 LPW depending on the colour temperature of the white light generated.

The present LPW efficacy at 1 W drive amounts to a wall plug efficiency (WPE) of 39.5%. Thus, greater than 60% of the electrical drive current is converted to heat. Typically, so called power chips are about 1 mm square and are driven between 1 W and 3 W. This amounts to a thermal load density of 0.6 to higher than 1.8 W/mm$^2$. This is a high figure compared to any other semiconductor device, resulting in the need to provide specific high performance packaging solutions. To date, most packaging has been adapted from the IC industry, where thermal densities are orders of magnitude lower 1-3 W/cm$^2$.

It is also of particular interest to maintain the small format light emitting device at a low temperature during operation, as the junction temperature of the LED dramatically affects both its life time and its overall efficiency. As a basic rule every 10° C. increase (above 25° C.) in junction temperature can reduce the life time of the LED by 10 kHrs for a Galium Nitride LED. It is also a consequence of the increase of the junction temperature that the overall efficiency of a state of the art vertical type LED drops. For example, increasing the junction temperature from 40° C. to a 70° C. will reduce the efficacy of the LEDs by more than 10%. It should noted that this effect is increasingly severe and nonlinear. Thus, appropriate packaging solutions need to be developed to ensure performance is maintained and the operating temperature of the light emitting device is maintained for a given change in the junction temperature as well as the ambient temperature.

The Thermal Resistance of a package is the measure of how well a package can conduct heat away from the junction of the LED. Current state of the art modules have a thermal resistance of between 4 and 15 K/W. Many methods have been successfully employed to improve the thermal resistance of LED module packages. These include the use of shaped metal lead frames in array formats, as described in U.S. Pat. No. 6,770,498, the use of bulk Aluminium Nitride ceramic tiles with electrical tracking on top, as described in published U.S Patent Application 2006/0091415A1, and the use of flip chip LEDs on tracked ceramic tiles with through vias to allow surface mounting, as described in published U.S Patent Application 2006/0091409A1.

The LEDs themselves have been engineered to produce a low thermal resistance path from the junction to the package where the heat is spread, such as the flip chip approach described above (U.S Patent Application 2006/0091409A1), in which the junction is very close to the package. In another approach to providing LEDs with high current and thermal driving capabilities, the vertical type n-p contact configuration in GaN material systems has been recently adopted. Examples of this have been disclosed in U.S. Pat. No. 6,884,646 and published U.S. Patent Application 20060154389A1. These documents describe the use of high thermal conductivity materials, such as Copper, to provide low thermal resistance from the junction to the package. More recently, improvements to these vertical type LED designs with respect to optical extraction performance promise even greater wall plug efficiency chips as described in UK patent applications 0704120.5 and 0714139.3.

Figure 1:
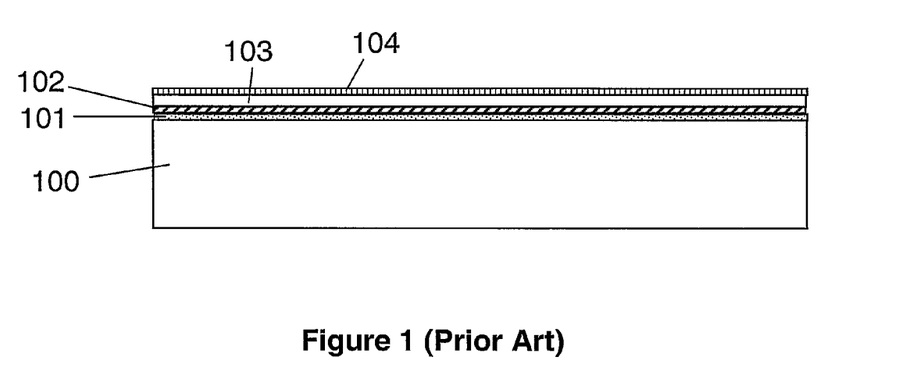
FIG. 1 (prior art) shows a cross section of an insulated metal substrate printed circuit board (IMS-PCB)

We now review *Insulated Metal Core Printed Circuit Boards*, as their use is common place. Insulated metal substrate printed circuit boards (IMS-PCB) are described in U.S. Pat. No. 4,810,563. These are use in many applications including power electronics and LED packaging. The structure of devices using this approach is shown in FIG. 1.

The metal substrate 100 is commonly Aluminium or copper and ranges in thickness between 0.5 mm to 3.2 mm. On top of the substrate is an adhesive layer 101 typically consisting of particulate loaded epoxy. The particulates are chosen to increase the thermal conductivity and include Aluminium Nitride, Diamond and Beryllium Nitride. The choice of materials for the adhesive layer 101 is important as the IMS PCB will undergo solder operations with temperatures used during reflow being as high at 320° C.

Layer 102 is a polyamide film. On top of layer 102 is layer 103 an electrical circuit layer than usually consists of copper. Layer 103 has two functions. One is heat spreading and the other is to provide the electrical circuit layout for the application. On top of this layer is an insulator layer 104 to prevent surface short circuits and corrosion.

Typically, to get the required electrical isolation of kilovolts using a polyamide material (layer 102), a 75 micron thick sheet is needed. For this, the thermal conductivity is only 2.2 W/(m·k). This level is adequate for power electronics where thermal load densities are of the order of Watts/square-cm and a significant improvement in performance over FR4 circuit boards. However, if this type of IMS-PCB is used with the LED placed directly on the PCB, then high junction temperatures will occur, as the thermal load will not be able to spread adequately in layer 103.

The IMS-PCB is widely used in the LED packaging industry, as it can be used to mount ceramic packages, which perform the function of heat spreading and thus make the thermal load equivalent to that of power electronics. In addition to this advantage, the IMS-PCB can be machined with holes to allow mechanical attachment to a heat sink.

Figure 2:
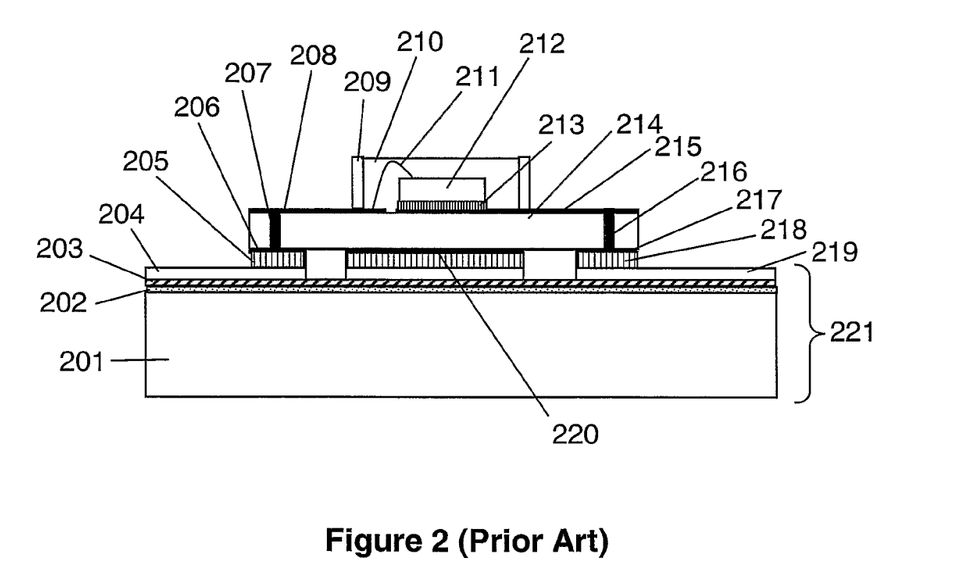
FIG. 2 (prior art) shows a cross section of an LED package where the LED is mounted on a ceramic tile having conductive vias and which is also attached to a IMS-PCB.

Of course, all these layers of packaging create extra cost and extra interfaces that increase thermal resistance. The best LEDs packaged in ceramic modules on IMS-PCBs provide a thermal resistance of about 10-15 K/W from the junction to the base of the module. An LED packaged in this way is shown in FIG. 2. The metal substrate 201 has the adhesive layer 202 attaching a polyamide electrical insulation layer 203. On top of this is the metal circuit tracking layer 204. This assembly comprising layers 201, 202, 203 and 204 is the IMS-PCB 221. On top of this is soldered or bonded, using layer 205, the electrically insulating but thermally conducting ceramic tile (214), with the LED (212) attached by a solder or adhesive layer 213. The ceramic tile, 214, can be formed from any number of ceramics, such as alumina or aluminium nitride. The top electrical connection from the LED (212) to the electrical circuit layer 208 on the top of the ceramic tile (214) is via a wire bond 211. The electrical circuit layer 208 is in electrical contact with the bottom electrical circuit layer 206 through the use of an electrical via 207. The bottom electrical contact of the LED 212 is in electrical contact with the top electrical contact 215 of the ceramic tile through the use of a solder joint 213. This in turn is in electrical contact with the bottom side (217) of the ceramic tile 214 through the use of additional electrical via or vias 216.

The use of the thermally conductive ceramic tile 214 ensures that the large bottom contact 220 acts as the thermal path to the IMS PCB 221, but there is no electrical connection as no electrical vias are used in this section of the ceramic title 214. Thus, the top electrical contact to the LED and the bottom electrical contact to the LED are separated through the used of the IMS PCB 221, and any heat sink attached to the bottom side of the IMS PCB 221 is electrically isolated. This is an important issue, if typical metal, graphite or conductive plastic heat sinks are used to prevent the heat sink becoming electrically live. The LED 212 is encapsulated with a non conducting epoxy or silicone encapsulant 210, held in a cup or receptacle 209 to allow good light extraction. Lenses are often used in addition, although this is not depicted as this is not the focus of the present invention. The use of a ceramic tile allows for smooth surface on which to attach the LED. With LED solder joints being as thin as 3 um (gold tin solders), the surface morphology of the ceramic tile this is an important factor.

By cutting into the metal core of the IMS PCB and soldering a ceramic tile in direct contact with the core of the board, the thermal resistance can be reduced. The best LEDs of the prior art, which are packaged using Aluminium Nitride ceramic tiles soldered into the core of the IMS PCB, offer thermal resistance of 4 K/W from the LED junction to the base of the modules.

Figure 3:
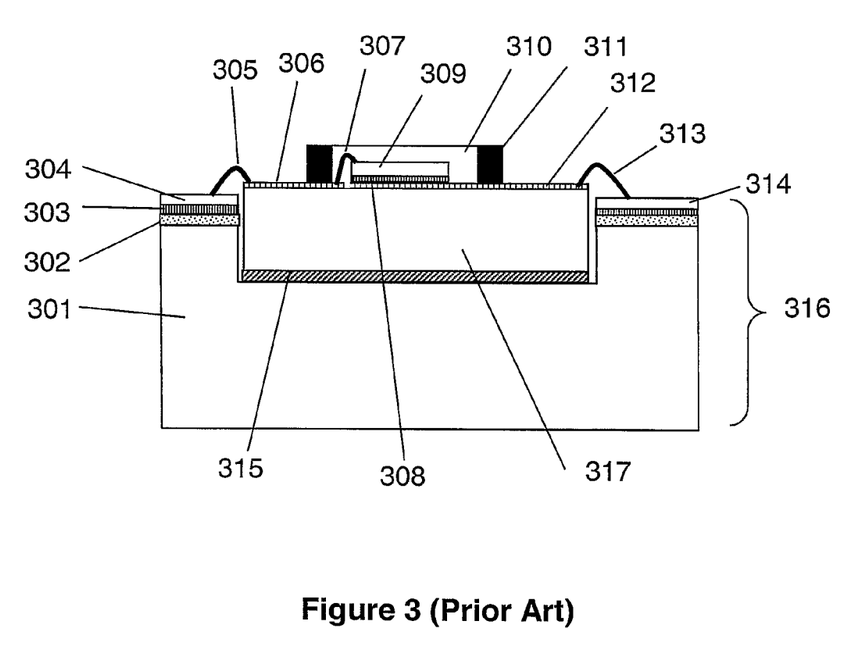
FIG. 3 (prior art) shows a cross section of an LED package where the LED is mounted on a ceramic tile which is mounted in direct thermal contact with the core of an IMS-PCB.

An LED packaged in this way is shown in FIG. 3. The metal substrate 301 has an adhesive layer 302 attaching a polyamide electrical insulation layer 303. On top of this is the metal circuit tracking layer 304. This assembly comprising layers 301, 302, 303 and 304 is the IMS-PCB 316. The electrical tracking of the IMS-PCB 316 and the electrical circuit layer 306 of the ceramic tile 317 are electrically connected to together through the use of wire bonds 305. The ceramic tile, 317, can be any number of ceramics such as alumina or aluminium nitride, although aluminium nitride is preferred due to its high thermal conductivity. The top electrical connection from the LED (309) to the electrical circuit layer 306 on the top of the ceramic tile (317) is via a wire bond 307. The bottom electrical contact of the LED 309 is in electrical contact with the top electrical contact 312 of the ceramic tile through the use of a solder joint 308.

The use of the thermally conductive ceramic tile 317 ensures that there is a low resistance thermal path to the metal substrate 301. Thus, the top electrical contact to the LED and the bottom electrical contact to the LED are separated through the used of the IMS PCB 316, and any heat sink attached to the bottom side of the IMS PCB 316 is electrically isolated through the use of the ceramic tile 317. This is an important issue if typical metal, graphite or conductive plastic heat sinks are used to prevent the heat sink becoming electrically live. The LED 309 is encapsulated with a suitable encapsulant such non-conducting epoxy or silicone encapsulant 310, held in a cup or receptacle 311 to allow good light extraction. Lenses are often used in addition, although this is not depicted as this is not the focus of the present invention.

Figure 4:
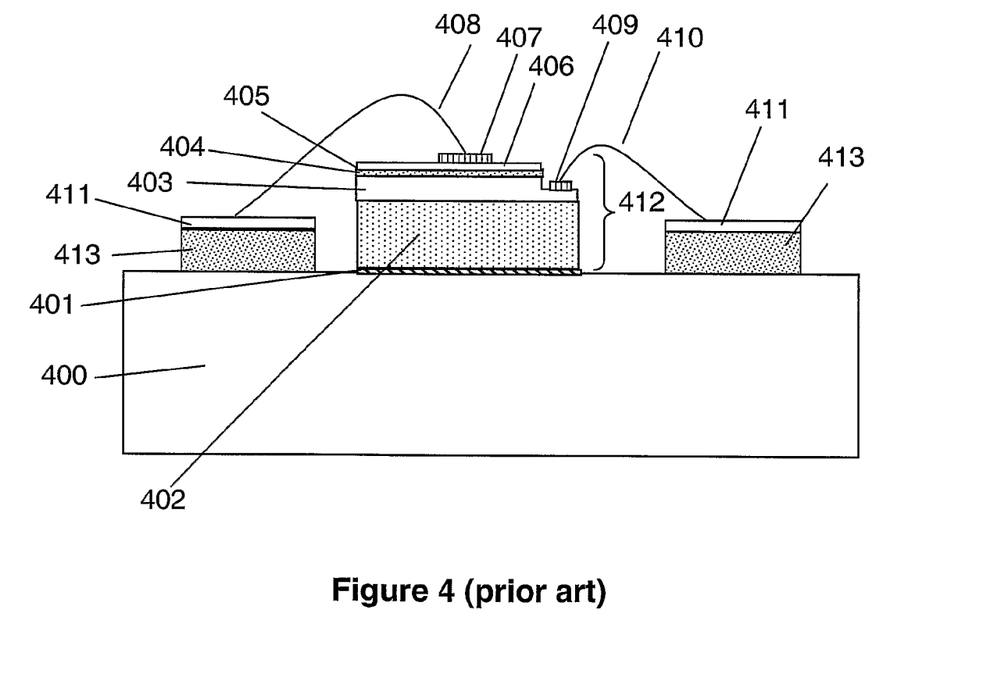
FIG. 4 (prior art) shows a standard lateral LED grown on sapphire with an electroplated copper plate package.

A recent paper by K C Chen et al at the Electronic Components and Technology Conference 2007 describes how electroplating of standard LEDs on sapphire substrates can be used to remove solder joints and form the LED submount directly on the sapphire substrate (coated with a seed layer of metal to permit the electroplating). This arrangement is shown in FIG. 4.

The LED 412 consists of a sapphire substrate 402 thinned to 100 microns and upon which has been grown a layer of n-doped semiconductor such as Gallium Nitride. The electrical contact and wire bond pad 409 is in contact with this n-doped semiconductor and forms the n contact to the p-n junction 404. The p-type semiconductor 405 is in contact with the top transparent contact layer 406, which in turn is in contact with the metal wire bond pad 407. A thin layer of metal 401 is deposited or evaporated onto the sapphire substrate 402. This metal layer forms the seed layer for subsequent electroplating. The LED 412 is embedded in the copper plate 400 via electroplating. The electroplating can produce any thickness of copper plate given sufficient time in the plating solution.

The wire bonds 408 and 410 provide electrical paths from the p-contact 407 and the n-contact 409 to a conductive wire-bondable layer 411 on an insulator 413. Thus, the electrical paths are insulated from the copper plate 400. The lateral chip 412 has a sapphire substrate 402, which provides electrical isolation between the thermal path and the package 400. This is a desirable feature, as it permits simplification of the packaging, thereby allowing the module to be mounted directly on a electrically and thermally conducting material such as a heat-sink without it being electrically live. This is particularly important when high DC or AC voltages are present and for safety reasons in the event of driver failure or short circuit.

The thermal performance of this kind of LED grown on a sapphire wafer is poor, as the thermal conductivity of sapphire is low at 40 W/(m K) and the wafer is typically quite thick at 100 microns, thus creating a large thermal resistance path as high as 2.6 K/W. Many manufactures thin the wafer after processing to minimise the thermal resistance. Nevertheless, these type of chips show a drop in efficiency, when driven hard (>0.5 W electrical drive power), due to elevated p-n junction temperatures associated with heat build up in the chip. Another issue for this kind of device is that of current crowding around the contacts 409 and 407, with associated below optimum current injection into areas not near the p and n contacts further reducing efficiency. In addition, the light extraction can be quite poor due to trapped modes in the sapphire substrate 402.

In the LED device 412 of the prior art, both n and p contacts are pressed into a soft polymer on a glass sheet. The 3 mm copper submount is then electroplated onto the back of the chip and the glass sheet and polymer then removed by dissolving the polymer. The sapphire is 100 microns thick and thus the thermal resistance of this part of the LED package is still relatively high. This thinning of sapphire is common commercial practice. Typically, the sapphire is thinned from 400 micron to 100 microns thick or so, depending on the wafer size post the growth of the LED by MOCVD or MBE. However, thinning the sapphire less than 100 microns causes the 2 inch or larger sapphire wafers to become extremely fragile during processing.

SUMMARY OF THE INVENTION

According to a first aspect of the present invention, a light emitting module comprises:
 a light emitting device;
 an electrical isolation layer;
 a grown metal submount; and,
 a metal deposited seed layer disposed between the light emitting device and the grown metal submount, wherein the metal submount is grown using a method selected from a group which includes electroplating, electroforming, electrodeposition and electroless metal plating;
 the thermal resistance of the light emitting module is below 2 K/W; and
 the electrical isolation layer is interdisposed between the grown metal submount and a light emitting region of the light emitting device.

In the present invention a novel sub-mount is proposed that allows the heat spread and the first part of the heat sinking. The sub-mount is a grown metal that is electroplated, electroformed, electrodeposited or electroless plated, using metals such as copper, alloys of copper and thus the thermal resistance is minimised at this stage.

In the present invention, the high thermal and high electrical conductivity paths of the light emitting device residing on the sub-mount are separated in order to achieve efficient operation. An electrically insulating and thermally conducting layer is at least partially disposed across the interface between the grown semiconductor layers of the light emitting device and the formed metal layers of the sub-mount to further improve the electrical isolation of the light emitting device from the grown sub-mount. It is an object of the present invention that the layer or multiple layers is/are deposited at low ambient temperatures to prevent stress associated with high temperature deposition.

As such, the present invention employs an efficient method of mounting an LED on a high thermal dissipation submount, which benefits from low cost of manufacture as well as contributes towards improved LED performance and extended lifetime. The present invention provides a means of allowing continuous high power injection into a small format light emitting device while ensuring that the light emitting device is affixed to maintain a low operating temperature providing for maximum efficiency and the longest lifetimes. The invention replaces the use of solder joints to form the LED module.

Preferably, the module of the of the present invention further comprises a low cost metal 'former' to define an application specific heat spread and heat sink shape prior to electroplating or electroforming the LED. This former can be advantageously used in combination with the temporary substrate, mould or mandrel and removable compound to simplify the manufacture or to create more intricate designs. The former may comprise powdered metals that promote the electroplating in regions required for the application. This former can be made of metal fibers or wires or metal coated fibers to form complex mesh heat sinks in both 2 and 3 dimensions. When the LED submounts are electrodeposited or electroformed the former is encased with the electrodeposited metal forming a rigid structure. In a further extension to the present invention, the low cost PCB is used as part of the 'former' for the heat spread and heat sinking.

The light emitting device may further comprise a complex network of heat pipes interdisposed in the said grown metal former to allow for further improved passive or active heat dissipation.

In one embodiment of the present invention, electrodeposited or electroformed submounts are grown onto lateral LED chips that have deep thermal vias etched into the sapphire (these are metal filled during the electroplating process). This provides the mechanical strength to manage the 2 inch or larger sapphire wafers during wafer processing, whilst allowing superior thermal performance to that described by Chen et al at the Electronic Components and Technology Conference 2007. In addition, although the etched thermal vias cannot be easily soldered, they can be coated with a thin layer of high adhesion seed metal, using sputtering or other similar deposition technique, which is then subsequently electroplated to form a submount or heat sink.

The invention described allows a reduction in the thermal resistance from the LED junction to the heat spreader. By using thermal vias, the thermal resistance from the LED junction through the sapphire substrate to the heat spreader can be reduced from 2.5 K/W (prior art) to below 0.6 K/W. In another facet of the present invention, the use of shaped vias and appropriate metal coatings to increase light extraction from the lateral chip will be described. The top surface of the LED is protected from electroplating or electroforming by a wax or polymer on a temporary substrate or mold or mandrill. This wax or polymer can be removed after plating, releasing the LED module and allowing subsequent processing In another embodiment of the present invention, electrodeposited sub-mounts are grown onto an electrically isolated light emitting device with a vertical current path (EIVL), thus allowing for superior thermal performance while also providing electrical isolation from the sub-mount. The use of solder processes with high reflow temperatures of between 260 and 320° C. inherently builds stress into the LED package through coefficient of thermal expansion mismatches between the EIVL LED active region and the metal plate it is soldered on to. This stress will reduce the performance of the LED and impact the lifetime of it.

According to a second aspect of the present invention, a method of manufacturing a light emitting module of the first aspect, comprises the step of forming a metal submount on a light emitting device using a method selected from a group which includes electroplating, electroforming, electrodeposition and electroless metal plating. Preferably, the metal submount is formed at a temperature of less than 100° C.

It is preferred that method further comprises the step of using a temporary substrate, mandrel or mould in conjunction with a layer of removeable material to at least partially protect and isolate one surface of the light emitting device during the subsequent formation of the metal submount. Preferably, the layer of removeable material comprises a compound selected from a group which includes wax, polymer and rubber.

As the electro-deposition or electroplating process is usually carried out at low temperature (less than 100 degrees Celsius), mismatches in thermal expansion of materials used in the package construction are minimised and do not result in stress in the package associated with solder processes. The present invention allows the thermal resistance from the LED junction to the heat spreader to be reduced to below 0.3 K/W. The top surface of the LED is protected from electroplating or electroforming by a wax or polymer or other removable material on a temporary substrate or mould or mandrill. This wax, polymer or other removable material can be removed after plating, thereby releasing the LED module and allowing subsequent processing, such as wirebonding and encapsulation of the LED.

BRIEF DESCRIPTION OF THE DRAWINGS

Examples of the present invention will now be described in detail with reference to the accompanying drawings, in which.

DETAILED DESCRIPTION

Heat is a form of energy that is related to vibration at the molecular level, and is a by product of many processes. In the case of LEDs, this includes the recombination of photons in a semiconductor bandgap. Since LEDs and many other electronic components are sensitive to heat, it is important to remove excess heat that will adversely impact performance. In traditional light sources, such as incandescent lights, only a small proportion of the electrical energy is actually converted to useful light. The majority of the energy is converted to heat that must be removed from the light source. The heat energy may be transferred in one of three ways, namely by conduction, convection or radiation.

Conduction is the method in which heat energy is transferred between two objects that are in contact with one another. Convection is the process by which heat is transferred through the movement of gas or liquid from an area of higher temperature to one of lower temperature. Hot air rising is an example of natural or free convection. Using a fan is called forced convection. Radiation is the method by which heat is transferred through emission of energy in the infrared.

In present incandescent lighting lamps, the majority of heat generated is transferred away by radiation. However, LEDs are quite different in that the majority of heat generated is transferred by conduction to a heat sink or lighting fixture. At this point, convection can then be used to transfer the heat to the surrounding air by convection. It is because of the existence of this conductive path, that LED systems must be designed differently for them to work properly.

When investigating the properties of a material for heat transfer, it instructive to consider the thermal conductivity of the material, which can be defined as follows:

$$k = \frac{Q}{t} \times \frac{L}{A \times \Delta T} \quad (1)$$

where Q is the quantity of heat transmitted in time t through a thickness L in a direction normal to a surface of area A across a temperature difference $\Delta T$. This expression is applicable under steady state conditions and when the heat transfer is dependent only on the temperature gradient. The thermal resistance of a material is the inverse its thermal conductivity.

In order to reduce the temperature difference across a defined region in a LED package, a material with a higher thermal conductivity can be employed. Additionally, or alternatively, a thinner layer of material may be used. Table 1 provides a list of the thermal conductivity for common materials used in light emitting devices (LED) and LED packaging. Also detailed is the coefficient of thermal expansion (CTE) for the same materials.

TABLE 1

| Material | Thermal Conductivity W/(m K) | Coefficient of Thermal Expansion (CTE) ($\times 10^{-6}$ m) |
| --- | --- | --- |
| Alumina | 18 | 6.9 |
| Aluminum Nitride | 170 | 4.7 |
| AuSn solder | 57 | 16 |
| Copper | 400 | 17 |
| Aluminium | 237 | 24 |
| Nickel | 90 | 13.6 |
| Tungsten | 160 | 4.3 |
| Silver | 419 | 18 |
| Gold | 318 | 14 |
| GaN | 130-225 | 3.1 |
| Sapphire | 40 | 8.4 |
| Silicon | 150 | 2.6 |
| Diamond | 900-1900 | 1.18 |

In the case of a Gallium Nitride LED, the thermal conductivity typically ranges between 130 and 225 W/(m·K). Once an LED has been grown, the thermal conductivity of the materials used for the package should in general be chosen to be no worse than this value, as otherwise the overall thermal resistance will be increased. As the junction temperature of the LED is sensitive to increases in temperature, the materials constituting the package should be chosen carefully to ensure the thermal resistance is minimised. An ideal material for thermal performance would be diamond, in the form of a diamond heat spreader and heat sink. However, the cost of such a solution would be prohibitive for most applications.

The coefficient of thermal expansion (CTE) for the materials must also be considered. Ensuring a good match between the package materials and the semiconductor light emitting device material eliminates stress build up during soldering or operation of the module. This will improve the overall reliability of the light emitting module when high power densities are injected into the LED.

There are three distinct heat flow regions in a typical LED package, namely the thermal conduction path from the junction to the base of the chip, the thermal conduction path from the heat spread region to the heat sink, and the thermal path from the heat sink to the heat sink surface where heat is dissipated through convection to the ambient environment.

The cooling requirement for the LED module can be determined from $$\Delta T/(P \times (1-WPE)) = R_{junction\ to\ chip\ base} + R_{heat\ spread(chip\ base\ to\ heat\ sink)} + R_{heat\ sink(cooling)} \quad (2)$$

where P is the total power dissipation of the module, which is computed from the product of the forward voltage and the forward current of the LED, and WPE is the wall plug efficiency. This effectively defines the heat the module is required to dissipate. R is the thermal resistance of various parts of the LED package, as indicated by the relevant subscript, and the temperature difference $\Delta T$ is given by:

$$\Delta T/(K) = T_{junction} - T_{ambient} \quad (3)$$

Table 2 lists the thermal resistance ($R_{junction\ to\ chip\ base}$) from the LED junction to the base of the chip for both prior art arrangements and for devices employing the present invention. It can be seen that the thermal resistance using the prior art approaches is significantly higher in each case than that when using arrangements of the present invention. From an inspection of Equation (2) it can be seen that the heatsinking requirement can be reduced for a given thermal load and a given $\Delta T$ by reducing the chip thermal resistance ($R_{junction\ to\ chip\ base}$) accordingly. Alternatively, for the same given amount of heat sinking, the LED junction temperature can be reduced, thus increasing both efficiency and life time of the LED.

TABLE 2

| Type of Chip | Thermal Resistance K/W |
| --- | --- |
| Conventional Lateral chip on thinned Sapphire solder attach (prior art) | 2.67 |
| Conventional Lateral chip on thinned Sapphire - electroplated (prior art) | 2.57 |
| Lateral Chip on thinned sapphire with thermal vias - electroplated | 0.55 |
| EIVL chip - soldered | 0.26 |
| EIVL chip - electroplated | 0.16 |

The next region of interest is the heat spreading region of the LED from the base of the chip to the heatsink. Again, anything done to reduce this thermal resistance will mean that, for a given thermal load and junction temperature, the amount of heat sink area can be reduced, which reduces cost and enables entry into applications were compact solid state lighting fixtures are required. One way to reduce this thermal resistance is by using high thermal conductivity materials with a thermal conductivity of 400 W/(m K), such as, but not limited to, aluminium or copper.

In the present invention, the heat spread and the first part of the heat sinking is grown metal that is electroplated, electrodeposited, electroformed or electroless plated, thereby allowing the thermal resistance to be minimised at this stage. The metal may comprise of Al, W, Au, Ag, Cu, alloys of copper or other suitable metal. The top surface of the LED is protected from electroplating or electroforming by a wax or polymer or other removable material on a temporary substrate, mould or mandrel. This wax, polymer or removable material can be removed after plating, thereby releasing the LED module and allowing subsequent processing of the module, such as wirebonding and encapsulation of the LED.

In a further variant of the present invention the use of a low cost metal 'former' is proposed to define an application specific heat spread and heat sink shape prior to electroplating or electroforming the LED. The heat sink shape may also permit further applications, where the formed metal may act as a reflector cup for the emitted light or holder or further components. The former can be powdered metals that promote the metal growth in regions required for the application.

In some embodiments of the present invention a metal or metal coated mesh or former can be used to create more complex heat spreading and heatsinking shapes. The use of such a mesh can facilitate high density low cost heat sinks as part of the package of the LED. This former can comprise metal fibers or wires disposed in the grown metal sub-mount to form a complex mesh heat sink in both two and three dimensions. When the metal LED submounts are grown by electroplating, electrodepositing, electroforming or electroless plating, the former is encased with the electrodeposited metal forming a rigid structure. The fibers of the former may include carbon or graphite, which have thermal conductivities as high as 640 W/(m K), or any other fibre with high thermal conductivity properties. The fibres may also be coated with metal or treated to promote adhesion of the electroplated, electrodeposited or electroless plating metals. Various suitable chemicals exist for such treatment, including mercaptosilane.

When the LED submounts are electrodeposited or electroformed, they are encased with the electrodeposited metal forming a rigid structure with higher thermal performance than the surrounding metal. Appropriate use of these highly conducting fibers will ensure enhanced rapid heat spreading from the LED. In addition, high thermal conductivity powered or granular materials can be added to the former or electrodeposited material such that the thermal conductivity of the metal submount, module or heatsink is increased. Preferred materials include diamond or graphite in granular form, with granule sizes greater than 100 micron. The thermal conductivity may be as high as 1000 W/(m K) for diamond. Thus, the thermal conductivity of the submount would be a volume average of the metal and diamond material, and could perhaps be as high as 700 W/(m K).

Figure 5A:
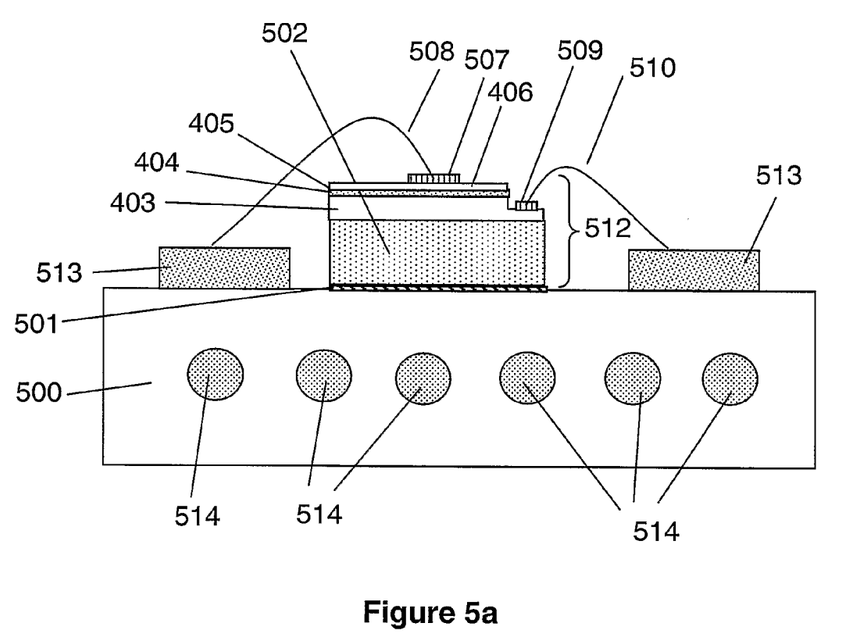
FIG. 5a shows a cross-section of an LED employing metal or thermally conductive fibers as a 'former' according to the present invention to create a complex LED module and heat sink arrangement.
Figure 5B:
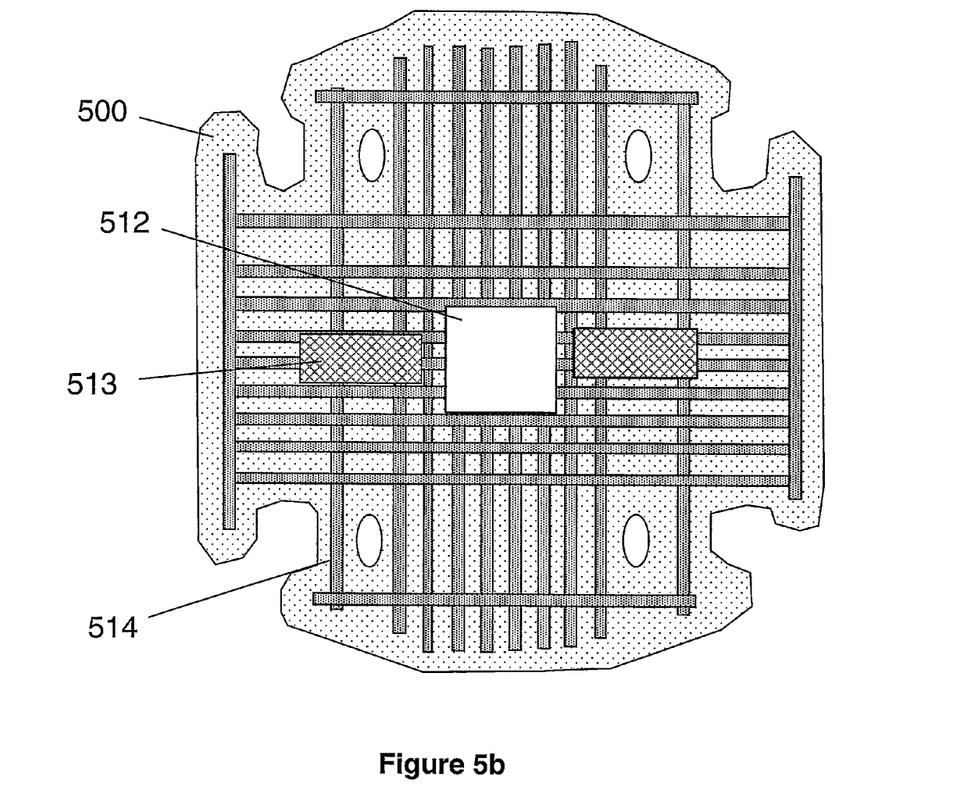
FIG. 5b shows an example grid former to create a hex shaped module.

An example of the present invention is shown in FIG. 5a, where a cross section of a light emitting device 512 includes a metal seed layer 501 located on the base and on which to grow the electroplated or electroless plated metal submount 500. The chip 512 is effectively joined to the former 514 by the metal electrodeposited, electroformed or electroless deposited 500 through it. The metal former can be used to define the overall shape for the submount and hence construct a standard format hexagonal module Hex star, as shown in plan view of FIG. 5b. The zone around the LED chip 512 is effectively the heat spread region for the LED and the metal former can be shaped such that extra surface area can be created to provide extra area in the module for cooling via convection. The shorter the path from the LED to the point where cooling begins the less thermal resistance there will be and the cooler the LED will be. The metal former 514 can be a simple two dimensional wire mesh or it can be a more complex photoformed part or even a three dimensional part designed to maximise the heat sinking through large surface area. The former may additionally be coated in a metal or other coating or chemical treatment to seed the electroplating, electrodepositing, electroforming or electroless plating of the surrounding metal submount 500.

In a preferred embodiment of the invention, a low cost PCB 513, such as but not limited to FR4 provides a separate electrical track from the p and n type contacts 507 and 509 via the wirebonds 508 and 510. The PCB ensures that the electrical path remains separated from the thermal path. The bottom side of the PCB can be used as part of the former for the module or heatsink and pins and vias through the PCB can be used to mold and form the module or heatsink. The use of an electroformed module and a former provides a means to replace the solder joint of traditional modules and hence improve reliability, lifetime and temperature cycling capabilities of the complete light emitting package.

In a further embellishment of the present invention, the metal submount 500 may further comprise a complex network of heat pipes or rods interdisposed in the grown metal. The heat pipe arrangement can be in addition to the former 514 that is introduced, or it can be used in place of the former. The heat pipes may range in diameter from 0.1 mm to greater than 5 mm, or greater than 10 mm. The heat pipes can further comprise hollow pipes filled with a static high thermal conduction material or a fluid that is circulated to allow for efficient active heat dissipation. The fluid may comprise water circulated through a refrigeration system.

In some embodiments of the present invention, electrodeposited submounts are grown onto lateral LED chips that have deep thermal vias etched into the sapphire, and which are metal filled during the electroplating process. This provides the mechanical strength to manage the 2 inch or larger sapphire wafers during wafer processing, whilst allowing superior thermal performance as compared to devices of the prior art. The etched vias can take arbitrary shapes such as arrays of trenches or holes with dimensions of between 5 microns and 500 microns in size. Additionally, the vias are wet or dry etched and help eliminate the need to lap and polish the complete growth substrate to sub 200 micron thicknesses, which is typically carried out for devices of the prior art. Hence, this also improves the yield of the light emitting devices. In addition, although the etched thermal vias cannot be easily soldered, they can be coated with a thin layer of high adhesion metal on which a submount or heat sink can subsequently be electroplated or electroless plated.

Figure 6A:
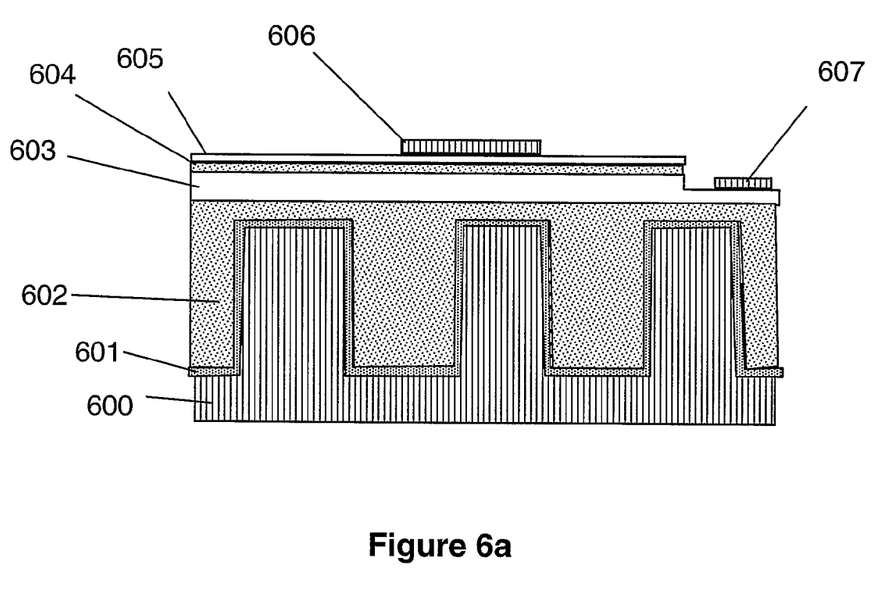
FIG. 6a shows a cross section of a lateral LED on a thinned substrate with electrodeposited or electroformed thermal vias according to the present invention.

FIG. 6a shows a cross section of the lateral LED of the present invention on a thinned sapphire substrate with thermal vias. In the preferred example the base growth substrate material 602 is sapphire or other low thermal performance material employed for growth of light emitting devices, such as Si, SiC, Ge, LiAlO or other suitable material. The LED structure consists of n-doped and p-doped semiconductor 603 and 604. The LED is coated with a current spreading layer 605 and a conductive contact 606. Element 607 is the other contact to the LED junction and pads 606 and 607 are suitable for wire bonding.

There is much variety in the LED device as well as the materials used in its construction, and these are important to the performance of the device although do not impact on the present invention. The ratio of the full thickness substrate to that of the thinned substrate should be sufficient to provide mechanical support during LED wafer processing. In addition this ratio should be such that, when coated with the metal seed layer 601 and subsequent electroplated or electroless plated metal 600, an increase in thermal performance is achieved. The growth substrate 602 provides for electrical isolation between the light emitting region of the device and the metal submount.

In a preferred example of the present invention the ratio of the full thickness substrate to the preferentially thinned regions is 1:5, 1:10 or 1:20, as this provides for good mechanical strength of a 2 inch sapphire wafer. The difference height between the full thickness substrate and the preferentially thinned regions is 90 microns (10 microns for the full thickness regions and 100 microns for the preferentially thinned regions), which provides for a reduction in thermal resistance from 2.57 K/W (prior art) to 0.55 K/W, as shown in table 2.

The cross-sectional aspect ratio of the holes can take various forms, although in a preferred embodiment the holes are tapered inwards from the base of the substrate towards the active region of the LED to enhance seed metal adhesion and optical light extraction from the LED. In another embodiment of the present invention, pyramidal regions are formed in the substrate by techniques such as wet etching or concave shapes by use of shadow or graded masking techniques.

Layer 601 can be a single layer or a multilayer of metals. As light from the LED is incident on the metal, it is advantageous that the metal or metals of 601 are also chosen to ensure high reflectivity and low optical loss. In a preferred example of the present invention, the mirror material is a stack of silver and nickel, as the silver provides excellent reflectivity and the nickel provides an excellent electroplating surface. As there is no requirement for electrical conduction, a multilayer stack of dielectrics can be used to enhance the reflectivity of the metal layer or layers 601, provided that this set of materials does not adversely affect the thermal performance of the device. The use of pyramidal, concave, convex or V-groove type structures provides the ability to employ retro-reflector type surfaces which can provide improved light extraction.

The seed layer of 601 can be evaporated nickel or copper although any metal that can provide a seed layer for subsequent and sufficient adhesion. This metal stack can be deposited in a number of ways not limited to evaporation, sputtering, magnetron sputtering, electron beam evaporation and any number of plasma enhanced deposition techniques the key requirement is that the adhesion to the substrate is strong and durable.

Figure 6B:
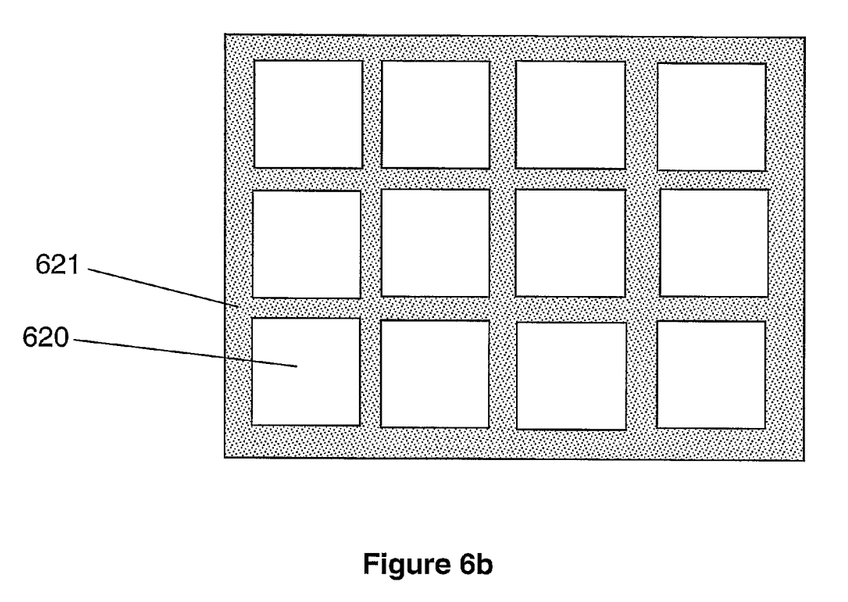
FIG. 6b shows a preferred example of the thermal via arrangement.

FIG. 6b shows the plan view of a preferred example of the rear surface of the light emitting device substrate. The substrate is often a wafer having a diameter of 2, 3, 4, 5 or 6 inches. It is patterned and preferentially thinned in region 620. The remaining full thickness substrate 621 is designed to provide mechanical support to the wafer. Any pattern, regular or irregular of any dimensions can be used, provided it allows for sufficient mechanical stability and thermal performance at the device level.

Although any wet chemical or dry etching technique can be used, in a preferred example of the thinning of the substrate the wafer may be patterned using standard photolithography, with a 10 micron non-thinned region size and a 90 micron thinned region size, and dry etched using ICP etching with a Nickel hard mask. Alternative techniques, such as imprinting, may also be employed for the definition of the via patterns.

In another variant of the present invention, the high thermal and high electrical conductivity paths of the light emitting device are separated prior to growth of the metal submount in order to achieve efficient operation. An electrically insulating and thermally conducting layer is at least partially disposed across the interface between the grown semiconductor layers of the light emitting device and the formed metal layers of the sub-mount, to allow for electrical isolation of the light emitting device from the grown sub-mount. It is an aim of the present invention that the layer or multiple layers is/are deposited at low ambient temperatures to prevent stress associated with high temperature deposition. In a preferred aspect of the invention the light emitting device comprises a vertical type current flow or flip chip, where the light emitting region is in close proximity to the high thermal conduction metal formed submount.

The metal that is electroplated, electrodeposited, electroformed or electroless plated to form the sub-mounts, modules or heatsinks is further grown onto the electrically isolated vertical light emitting device EIVL LED, thus allowing for superior thermal performance. In addition the removal of the solder process will reduce the stress in the LED and increase the lifetime. The EIVL LED devices have a high thermal conductivity, but also benefit from an electrically isolating layer that is integrated into the vertical LED structure to combine the electrical isolation advantage of lateral LED devices with the thermal performance and current spreading benefits of the vertical type device at a wafer level process.

Removing the use of solder processes, with the associated high temperature reflow temperatures of between 260 and 320° C., inherently reduces the stress built in to LED packages. The electrodeposition, electroplating, electroforming or electroless plating process is usually carried out at low temperature, preferably less than 100 degrees Celsius. Thus, any mismatch in thermal expansion of materials used in the package construction does not result in stress build up in the package, which is a common drawback associated with solder processes. Electroless deposition can also be used and this is also usually carried out at low ambient temperatures. The lack of package stress will enhance the performance of the LED and enhance the lifetime of the LED, while also allowing for reduced manufacturing cost. The invention, as described herein, allows the thermal resistance from the LED junction to the heat spreader to be reduced from 0.26 K/W to below 0.16 K/W, as shown in table 2.

Figure 7:
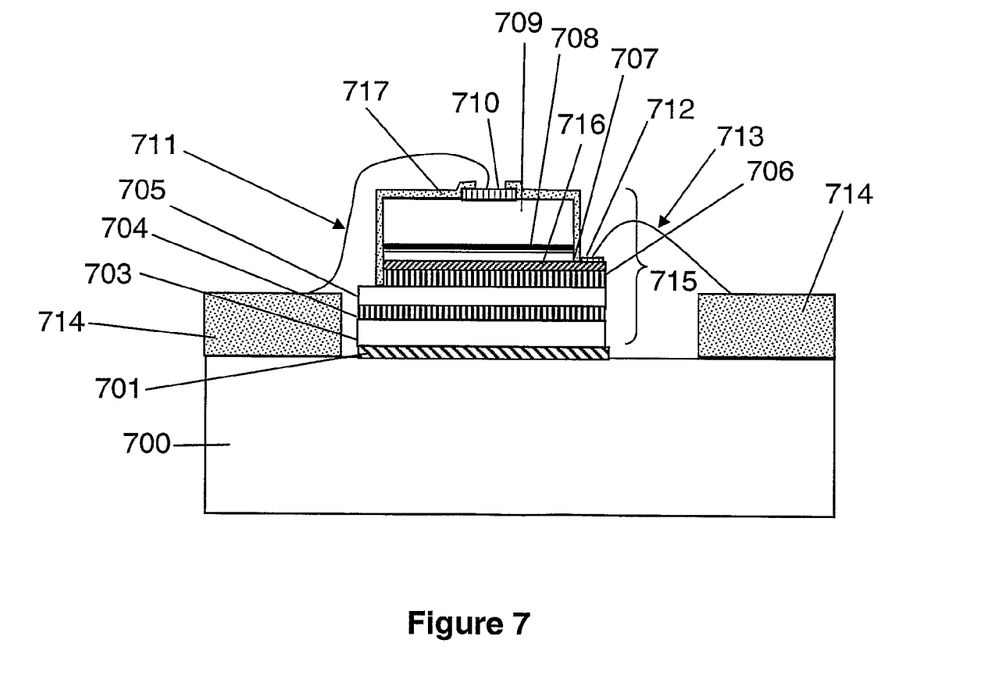
FIG. 7 shows a cross section of an EIVL LED with electroformed or electrodeposited metal module according to the present invention.

The EIVL LED can be coated with a seed metal layer and a metal submount, module or heatsink can be electroplated onto the chip, as shown in the cross section view of FIG. 7. Element 700 is the grown metal substrate, formed from metals such as aluminium, copper or alloys of copper. The seed layer 701 can be electrodeposited nickel or copper or evaporated nickel or copper, although any metal or coating that can provide a high adhesion seed layer for subsequent electroplating, electroforming and electroless deposition can also be used. Other such suitable materials include Ti, Cr, Ti/Al, Ni, Pd and Rt. This metal stack can be deposited in a number of ways, including, but not limited to, evaporation, sputtering, magnetron sputtering, electron beam evaporation and various plasma enhanced or ion assisted deposition techniques. The key requirement here is that the adhesion to the substrate is strong and durable. Any conducting substrate can be used for item 703, including materials such as, but not limited to, silicon, aluminium nitride and gallium arsenide. In a preferred embodiment substrate 703 is a chip level grown metal substrate, which could be either electroplated or electroless plated copper or alloys of copper, for example. The metal substrate is typically 40-140 microns thick.

Layer 704 is an adhesion layer located between layers 703 and 705 and chosen for high thermal conductivity. The electrically insulating layer 705 is a single layer or multiple layers of dielectrics deposited at a controlled temperature and stress. The preferred materials for this layer are diamond like carbon (DLC), Aluminium Nitride, SiC and Chemical Vapour Deposition (CVD) Diamond. as these have high thermal conductivity and high dielectric strength. However, any electrically isolating material may also be used. The electrical break down voltage of layer 705 is in excess 1 kV to provide sufficient isolation for use in the particular application, for example domestic or commercial lighting. Layer 706 provides adhesion and stress relief between layers 705 and 716 and is chosen for high thermal conductivity. Layer 716 is mirror layer and is an optical mirror for the p-n junction formed above the p-doped semiconductor layer 707. Layer 708 is the p-n junction region of the LED and layer 709 is the n-doped region. Layer 710 is the top electrical contact.

A region of the vertical LED structure is etched through to the mirror layer 716. Element 712 forms a wire bondable surface to connect to the conductive mirror structure and the p-doped semiconductor. Wire bonds 713 and 711 connect both sides of the LED p-n junction to a simple circuit board 714. As the electrical connections to 712 are through the mirror 716 and layers 706, the electrical resistance of metals used in these layers is very low, and therefore good current spreading is achieved in these layers. Thus, the problems of current crowding that are present in lateral LEDs are avoided, but the benefit of an electrically isolated thermal path that lateral LEDs possess is maintained. In addition, the thermal resistance of the thermal path is low, as in a traditional vertical LED. The thermal performance of an EIVL LED packaged in this way can be as low as 0.16 K/W. The electrical connections from the EIVL LED are routed around on an extremely low cost circuit board that now has no requirement to spread heat. Details of encapsulation and phosphor conversion are omitted from this description, as any techniques employed for this functionality can by used in conjunction with this invention.

An example method of manufacture for the EIVL chip package and heat sink uses both a mold and a complex former consisting of carbon fibres and copper wires. The carbon fibres, with thermal conductivity 640 W/(m K), are used in the heat spread region to increase the conductivity of the critical heat spread region from 400 W(m K) to over 500 W/(m K). The copper wires are used to create the former for the heat sink. Initially, the EIVL LED chip or chips and PCB are pushed contact side down into a soft wax on a non-electrically conducting mold. This protects the top side of the LED and the top side of the PCB from electroplating. The EIVL chip has a copper substrate, which is 40-100 microns thick, and as a result does not require a seed layer to promote electroplating.

The carbon fibers are placed into the LED base and the back of the PCB, and the copper fibres are placed over them and between them. The copper fibers are longer than the carbon fibres and more widely separated, typically 1-3 mm apart and are crossed for electrical contact. The copper wire will form the fins of the heatsink. A few small drops of wax or glue are dropped onto the fibres and mold to secure them during electroplating. An electrical contact is made to the copper wires and the LED chip or chips and this assembly is placed in an electrodeposition bath to grow 3 mm of copper over the fibers. The thermal conductivity of the heat spread region is in excess of 500 W/(m K) and the heat sink area is 400 W/(m K). The rigidified copper an/or carbon fiber assembly is removed from the bath heated or soaked in solvent to remove the wax. The LED assembly is then wirebonded, encapsulated with silicone encapsulant to from a complete LED module.

As no solder processes have been used in the assembly of this module, and the material depositions processes to create the EIVL chip are performed at or near room temperature, there is little stress in the entire package which in turn results in an extremely stable long life LED. In addition, the thermal performance of the package and heat sink is so good that it is likely the LED junction temperature will only be 0.2 to 1 K over room temperature at high drive powers, resulting in an extremely efficient LED with a rated lifetime well in excess of 50,000 hrs. The package is also extremely cost effective, as compared to the multiple layers of high cost ceramic, the IMS PCBs, thermal interface compounds and large molded heat sinks that are presently used in many products.

The invention claimed is:

1. A light emitting module comprising:
   a light emitting device;
   a grown metal submount using a method selected from electroplating, electroforming, electrodeposition and electroless metal plating;
   a deposited metal seed layer disposed between the light emitting device and the grown metal submount,
   wherein the light emitting module further includes a former at least partially disposed within the grown metal submount and conjoined therewith, the former including regions of material different than the grown metal submount and adapted to provide a predetermined thermal conduction path for the spreading of heat generated in the light emitting device, whereby the light emitting module has a thermal resistance below 2 K/W.

2. A light emitting module according to claim 1, wherein the grown metal submount comprises a metal having a thermal conductivity in excess of 90 W/(m K).

3. A light emitting module according to claim 2, wherein the metal for the grown metal substrate is selected from aluminum, tungsten, gold, silver, copper, and an alloy of said metals.

4. A light emitting module according to claim 1, wherein the former comprises one or more materials selected from diamond-like carbon, coated carbon granules, uncoated carbon granules, and CVD diamond.

5. A light emitting module according to claim 1, further comprising a network of pipes or rods disposed within the grown metal submount and adapted to dissipate heat.

6. A light emitting module according to claim 5, wherein the pipes are hollow and are filled with either a static high thermal conduction material for passive heat dissipation or a circulating fluid for active heat dissipation.

7. A light emitting module according to claim 1, wherein the electrical isolation layer comprises an electrically insulating growth substrate which is patterned with features on a surface proximal the grown metal submount and distal the light emitting device, wherein the features extend greater than 25 microns into the growth substrate but are not in contact with the light emitting device, and the features are filled with metal, thereby forming part of the grown metal submount and enabling channels of enhanced thermal conduction through the growth substrate.

8. A light emitting module according to claim 7, wherein the former comprises fibers of material having good thermal conductivity.

9. A light emitting module according to claim 8, wherein the fibers comprise at least one of metal fibers and carbon fibers.

10. A light emitting module according to claim 8, wherein the fibers are coated to promote adhesion to the metal of the grown metal submount.

11. A light emitting module according to claim 7, wherein the former comprises one or more of powdered metal, metal wire and a metal mesh.

12. A light emitting module according to claim 7, wherein the former comprises a PCB.

13. A light emitting module according to claim 1, wherein the grown metal submount has a thickness of between 0.1 mm and 30 mm.

14. A light emitting module according to claim 1, wherein the light emitting device comprises an electrically isolated LED with a vertical type current flow and comprises the following layers:
   a first semiconductor layer having a doping of a first type;
   a second semiconductor layer having a doping of a second type;
   a light emitting region interdisposed between the first and the second semiconductor layers, wherein light generated from the light emitting region is extracted from a surface of the second semiconductor layer;
   an electrical conducting mirror layer disposed proximal the first semiconductor layer and distal the second semiconductor layer, the electrical conducting mirror layer at least partially extending across a surface of the first semiconductor layer, wherein at least 60% of the light incident on the mirror layer is reflected;
   a deposited isolation layer disposed proximal the electrical conducting mirror layer and distal the first semiconductor layer, the deposited isolation layer having electrical insulating properties and thermal conducting properties;
   a first electrode disposed on the electrical conducting mirror and not in contact with first and second semiconductor layers; and,
   a second electrode disposed on the second semiconductor layer.

15. A light emitting module according to claim 14, wherein the deposited isolation layer of the light emitting device comprises an electrically insulating material having a thermal conductivity greater than 130 W/(m-K) selected from diamond-like carbon, silicon nitride, aluminum oxide, and aluminum nitride.

16. A method of manufacturing the light emitting module of claim 1, comprising forming a metal submount on a light emitting device using a method selected from electroplating, electroforming, electrodeposition, and electroless metal plating; depositing a metal seed layer between a light emitting device and the grown metal submount; and disposing a former at least partially within the grown metal submount and conjoining the former and the grown metal submount, the former having regions of material different than the metal submount, and the former providing a predetermined thermal conduction path for spreading heat generated in the light emitting device, whereby the light emitting module has a thermal resistance below 2 K/W.

17. A method according to claim 16, wherein the metal submount is formed at a temperature of less than 1000 C.

18. A method according to claim 16, comprising the step of using a temporary substrate, mandrel or mould in conjunction with a layer of removeable material to at least partially protect and isolate one surface of the light emitting device during the subsequent formation of the metal submount.

19. A method according to claim 18, wherein the layer of removeable material comprises a compound selected from a group which includes wax, polymer and rubber.

* * * * *